United States Patent
Desieres et al.

(10) Patent No.: US 8,614,698 B2
(45) Date of Patent: Dec. 24, 2013

(54) ELECTRODE OF A LIGHT-EMITTING DEVICE OF THE OLED TYPE

(75) Inventors: Yohan Desieres, Grenoble (FR); Pierre Gidon, Echirolles (FR); Ludovic Poupinet, Sassenage (FR); Bruno Mourey, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 516 days.

(21) Appl. No.: 12/515,247

(22) PCT Filed: Nov. 20, 2007

(86) PCT No.: PCT/EP2007/062587
§ 371 (c)(1),
(2), (4) Date: Dec. 8, 2009

(87) PCT Pub. No.: WO2008/061988
PCT Pub. Date: May 29, 2008

(65) Prior Publication Data
US 2010/0141612 A1  Jun. 10, 2010

(30) Foreign Application Priority Data
Nov. 24, 2006  (FR) .................................... 06 10291

(51) Int. Cl.
*G09G 5/00* (2006.01)
*G09G 3/30* (2006.01)

(52) U.S. Cl.
USPC .............................. 345/204; 345/82; 313/506

(58) Field of Classification Search
USPC .............. 345/76–83, 204, 205; 313/483–512; 315/169.3
See application file for complete search history.

(56) References Cited

U.S. PATENT DOCUMENTS

| | | | |
|---|---|---|---|
| 7,023,013 B2 | 4/2006 | Ricks et al. | |
| 7,362,047 B2* | 4/2008 | Song et al. | 313/506 |
| 7,554,263 B2* | 6/2009 | Takahashi | 313/506 |
| 2001/0038102 A1 | 11/2001 | Kawase | |
| 2004/0206965 A1 | 10/2004 | Evans | |
| 2005/0116625 A1* | 6/2005 | Park et al. | 313/504 |
| 2006/0192483 A1* | 8/2006 | Nakanishi et al. | 313/504 |

OTHER PUBLICATIONS

International Search Report for PCT Application No. PCT/EP2007/062587 dated Mar. 7, 2008.
French Search Report for FR 0610291 dated Mar. 13, 2008.
Yong-Jae Lee, et al., "A High-Extraction-Efficiency Nanopatterned Organic Light-Emitting Diode," Applied Physics Letters, May 26, 2003, vol. 82, No. 21, AIP American Institute of Physics, Melville, NY.
Thomas Hofler, et al., "Modifying the Output Characteristics of an Organic Light-Emitting Device by Refractive-Index Modulation," Advanced Functional Materials, Nov. 3, 2006, pp. 2369-2373, vol. 16, No. 18, Wiley VCH, Wienheim, DE.

(Continued)

*Primary Examiner* — Stephen Sherman
(74) *Attorney, Agent, or Firm* — Nixon Peabody LLP (57) ABSTRACT

An electrode of a light-emitting device of the OLED type adapted for forming with a second electrode, an optical cavity, including at least one layer based on a material of refraction index $n_1$ including a structured face comprising a plurality of recesses filled with a material of refractive index $n_2$ different from $n_1$.

29 Claims, 2 Drawing Sheets

(56) References Cited

OTHER PUBLICATIONS

X. T. Hao, et al., "Colour Tunability of Polymeric Light-Emitting Diodes with Top Emission Architecture," Semiconductor Science and Technology, Jan. 1, 2006, pp. 19-24, vol. 21, No. 1, IOP Institute of Physics Publishing, Bristol, GB.

Joseph Shinar, "Organic Light Emitting Devices," 2003, pp. 106-121.

Do, Young Rag et al., "Enhanced Light Extraction Efficiency From Organic Light Emitting Diodes by Insertion of a Two-Dimensional Photonic Crystal Structure", Journal of Applied Physics, vol. 96, No. 12, pp. 7629-7636, Dec. 15, 2004.

Jeong, Soon Moon et al., "Enhancement of Normally Directed Light Outcoupling From Organic Light-Emitting Diodes Using Nanoimprinted Low-Refractive-Index Layer", Applied Physics Letter, vol. 92, No. 8, pp. 083307-1-083307-3 Feb. 2008.

Materson, Benjamin J. et al., "Increased Efficiency and Controlled Light Output from a Microstructured Light-Emitting Diode", Advanced Materials, vol. 13, No. 2, pp. 123-127, Jan. 2001.

Ziebarth, Jonathan M. et al., "Extracting Light from Polymer Light-Emitting Diodes Using Stamped Bragg Gratings", Advanced Functional Materials, vol. 14, No. 5, pp. 451-456, May 2004.

Ziebarth, Jonathan M. et al., "A Theoretical and Experimental Investigation of Light Extraction from Polymer Light-Emitting Diodes", Journal of Applied Physics, vol. 97, No. 6, pp. 064502-1-064502-7, 2005.

\* cited by examiner

ELECTRODE OF A LIGHT-EMITTING DEVICE OF THE OLED TYPE

CROSS REFERENCE TO RELATED APPLICATIONS OR PRIORITY CLAIM

This application is a national phase of International Application No. PCT/EP2007/062587, entitled "Electrode For A Light-Emitting Device Of The OLED Type", which was filed on Nov. 20, 2007, and which claims priority of French Patent Application No. 06 10291, filed Nov. 24, 2006.

DESCRIPTION

Technical Field and Prior Art

The invention relates to a structured electrode of a light-emitting device of the OLED (Organic Light Emitting Diode) type and to an OLED device including such an electrode. The invention will be particularly suitable for making a device emitting light of several wavelengths, i.e. a multicolor display device, based on organic light-emitting layers used in a display or a screen of the OLED type, and notably in a microdisplay or the OLED type of centimetric dimensions.

These microdisplays are small easily transportable screens and their viewing may be accomplished with enlarging optics. These devices are particularly suitable for producing viewing optics, for digital video or still cameras for example. These microdisplays are also suitable for operating in viewing glasses for example connected to a mobile video reader. A microdisplay should be inexpensive and have low electric consumption.

A standard OLED type microdisplay includes a stack of electroluminescent organic layers emitting light of white color. This stack is positioned between a matrix of anodes and a cathode common to the whole microdisplay. Light emission is produced through the cathode which is transparent. The organic layers are deposited on the anode matrix homogeneously. On the side opposite to the stack of organic layers, the matrix of anodes is also in contact with an active matrix of transistors, or a TFT (Thin-Film Transistor) matrix. With each transistor, it is possible to individually control light emission from each anode, representing a pixel of the microdisplay, by having a current flow between the anode and the cathode through the organic layers. In order to produce pixels of different colors (red, green and blue for example), a matrix of filters based on pigmented polymers is produced on a transparent host substrate and then transferred onto the cathode homogeneously. This matrix of filters is produced on the host substrate by photolithography of photosensitive pigmented polymers.

Such a microdisplay of the OLED type has low electric consumption. But taking the dimensions of the pixels of these screens (a few microns) into account, the dimensions of alignment margins taken for the step for transferring the matrix of filters onto the cathode are equivalent to the dimensions of the pixels themselves, reducing the useful surface area and notably increasing the cost of the microdisplay.

Such a matrix of filters may also be produced by photolithography directly on the cathode. But also in this case, an alignment during the photolithographic steps on the anodes and the transistors of the active matrix located under the organic layers is necessary, complexifying the production of this filter matrix. Further, this solution is particularly aggressive for the organic layers which may be deteriorated.

These electrodes, i.e. the anodes and the cathode, when they are sufficiently reflective, form optical cavities which filter the white light emitted by the organic layers, this filtered light being then transmitted through the cathode which forms a semi-transparent mirror. By optical cavity is meant, here and in all the remainder of the document, a geometrical space limited by at least two at least partly reflective surfaces, the alignment of which allows light rays to undergo multiple reflections therein. The color emitted by the pixel through the cathode then depends on the thickness of the organic layers and on the optical refractive index of these organic layers. This type of structure therefore does not require any matrix of filters based on pigmented polymers. The documents "Organic Light Emitting Devices" of J. Shinar, 2003, pages 106-121, and "Colour tunability of polymeric light-emitting diodes with top emission architecture" of X. T. Hao et al., Semiconductor Science and Technology, Vol. 21, No. 1, January 2006, pages 19-24, describe such structures applied in organic and inorganic light-emitting diodes, improving directivity, optical yield, and determining the color emitted by the pixels.

However, producing such a stack of layers, with which the optical cavities may be tuned onto different colors from one pixel to the other, while retaining the same stack of organic layers for all the pixels and by modulating the thickness of these layers from one pixel to the other, is complex.

In document U.S. Pat. No. 7,023,013 B2, the production of pixels with different colors is not obtained by modulating the thickness of the organic layers, but by integrating ITO (Indium-Tin Oxide) pads with variable heights between the organic layers and the anodes. Such a structure requires many photolithographic steps in order to define on each pixel a layer of ITO with a thickness corresponding to the desired color. This approach therefore remains costly, notably for producing microdisplays.

DISCUSSION OF THE INVENTION

An object of the present invention is to propose a solution for producing a light-emitting device of the OLED type which may emit light of different wavelengths from one pixel to the other, without complexifying the production of such a device, and at a cost less than that of methods of the prior art.

For this, the present invention proposes an electrode of a light-emitting device of the OLED type adapted so as to form with a second electrode an optical cavity, including at least one layer based on a material with a refractive index $n_1$, including a structured face, for example intended to be positioned on the side of the optical cavity, comprising a plurality of recesses filled with a material of a refractive index $n_2$ different from $n_1$.

Thus, a planar modulation of the effective optical refractive index of the electrode of an optical cavity is achieved, i.e. in the plane of the layer forming the electrode, without varying the height of this layer. It is therefore possible to change this effective refractive index by acting on the refractive indexes $n_1$ and $n_2$ of the materials used and/or by changing the shape and dimensions of the recesses, and to thereby obtain an optical cavity, the resonance frequency of which may be tuned onto any wavelength, so that the color of the light emitted by the optical cavity may for example be selected, without complexifying or increasing the production cost of the light-emitting device.

With the structured electrode, it is also possible to modify the direction of propagation of the light emission of the device by selecting the emitted modes, thereby optimizing the optical gain of the light-emitting device. When the recesses of the structured face are regularly distributed according to a recurrent pattern with a period close to the desired emission wavelength of the optical cavity, or more generally a period comprised between about half of this wavelength and about 1.5 times this wavelength, the invention then allows the guided modes emitted in the plane of the organic layers of the device to be suppressed or else these guided modes may radiate out of the device according to angles specific to the structuration geometry. This last solution notably allows the light emission to be concentrated in a cone, the central axis of which is substantially perpendicular to the planes of the organic layers. The number of photons which may be trapped in the organic layers may thereby be reduced by promoting light emission out of the component.

The pattern (shape, dimension, recurrent period, . . . ) of the recesses made at the structured face may therefore be selected according to the desired emission spectrum of the optical cavity, but also to the desired emission directivity.

The recesses may be regularly distributed over the structured face and/or be of substantially similar dimensions, with which the wavelength of the light emitted at the output of the optical cavity may be specifically defined.

The material of refracted index $n_1$ and/or the material of refractive index $n_2$ may be electrically conducting, for example based on metal.

The electrode may also include one lower layer based on at least one electrically conducting material, for example based on metal, on which the layer of refractive index $n_1$ is positioned. The material of refractive index $n_1$ may in this case be a dielectric material for example. It is therefore possible to select a material for which the refractive index $n_1$ may not exist for an electrically conducting material. With this configuration, it is also possible to benefit from selective etching.

In this case, when the material of refractive index $n_1$ and/or the material of refractive index $n_2$ is electrically conducting, an electric conduction link is maintained between the lower layer and the structured face including the recesses.

This electric conduction link between the lower layer and the structured face including the recesses may also be obtained by a portion of electrically conducting material connecting the lower layer to the structured face, for example when neither the material of refractive index $n_1$, nor the material of refractive index $n_2$, is electrically conducting. Thus, no electric conduction constraint is applied to one of the materials of refractive index $n_1$ or $n_2$. This portion of electrically conducting material may cross the layer of refractive index $n_1$ and possibly the material of refractive index $n_2$.

The electrode may further include an upper layer based on at least one electrically conducting material, positioned against the structured face of the layer of refractive index $n_1$, or on the layer of refractive index $n_1$. This upper layer may be optically transparent or partly transparent, and for example, based on ITO. This layer may also be a very fine metal layer, for example based on TiN and with a thickness less than or equal to about 10 nm, or comprised between about 2 nm and 20 nm. With this upper layer, the flow of electric current between the electrodes through the organic layers may be homogenized.

The material of refractive index $n_1$ and the material of refractive index $n_2$ may be dielectrics.

In this case, the electrode may further include, when the electrode includes the lower layer and the upper layer, at least one portion of electrically conducting material electrically connecting the lower layer to the upper layer.

The material of refractive index $n_2$ and/or the material of refractive index $n_1$ may be transparent or partly transparent.

The recesses may cross the layer of refractive index $n_1$.

The present invention also relates to a light-emitting device of the OLED type including at least one optical cavity formed by at least one portion of at least one layer based on an electroluminescent organic material positioned between two electrodes, at least one of the two electrodes being an electrode, also object of the present invention, as described earlier, each optical cavity forming a pixel of the light-emitting device.

Advantageously, the recesses of the structured face of the electrode may be positioned on the side of the optical cavity.

With this device, it is possible to obtain specific light emission at the output of the optical cavity by means of the structured electrode. By means of the structured electrode, the color emitted by the pixel formed by the optical cavity as well as the direction of the emission may therefore be defined by achieving specific structuration of this electrode, either by the dimensions and shapes of the produced recesses and/or by their arrangement on the structured face of the electrode and/or by selection of the refractive indexes $n_1$ and $n_2$.

The material of refractive index $n_2$ filling the recesses of the structured face of the electrode may be the electroluminescent organic material of the layer positioned between both electrodes.

In an alternative, the material of refractive index $n_2$ filling the recesses of the structured face of the electrode may be a material distinct from the electroluminescent organic material of the layer positioned between both electrodes.

The light-emitting device may further include a substrate against which one of the electrodes of the optical cavity is positioned, this electrode being for example able to form an anode of the pixel defined by this optical cavity. This electrode may be notably a structured electrode, object of the present invention, as described earlier.

The light-emitting device may further include a plurality of optical cavities comprising a structured electrode such as described earlier, forming a plurality of pixels of the light-emitting device of the OLED type.

In this case, one of the electrodes, for example the structured electrode, of each optical cavity, may be positioned against the substrate, for example forming an anode of a pixel of the light-emitting device.

The dimensions and/or the period of the recesses of the structured electrodes may therefore differ from pixel to the other, in order to obtain pixels of different colors. A color screen may thereby be easily produced by means of a single photolithography.

The electrodes of the different pixels may be electrically insulated from each other.

The electrodes of each optical cavity which are not positioned against the substrate may be formed by a single electrode common to all the optical cavities, this common electrode for example being the cathode of the pixels of the light-emitting device.

The substrate may include at least one addressing circuit electrically connected to the electrodes positioned against the substrate and driving the pixels of the device. The addressing circuit may include a matrix of transistors, each of the pixels being able to be driven by a transistor of this matrix via the electrodes positioned against the substrate. It is particularly advantageous if the structured electrode is the electrode which is in contact with the active matrix of transistors. Filtering components may thereby be produced, i.e. structured electrodes, objects of the present invention, before depositing organic layers on these electrodes, and it is possible to thereby benefit from submicron alignment means of microelectronic technologies. With this, it is notably possible to reduce the required alignment margins and therefore reduce the surface cost of the device.

With such an electrode, it is possible to avoid deposits of electroluminescent organic layers on electrodes of different heights and avoid multiple photolithographic steps for specifying the color of each pixel. In the invention, with a single step of photolithography, it is indeed possible to end up with modulations of different index of each pixel of a matrix including several structured electrodes, objects of the present invention.

The device may further include, when the material of refractive index $n_1$ and the material of refractive index $n_2$ are dielectrics, a portion of conducting material electrically connecting the addressing circuit to the electrodes.

The present invention also relates to a method for making a light-emitting device of the OLED type, including at least the steps of:

a) depositing a layer based on a material of refractive index $n_1$ on a substrate, b) etching a plurality of recesses through at least one face of the layer, c) depositing a material of refractive index $n_2$, different from $n_1$, in the recesses.

The method may further include before step a), a step for depositing a lower layer based on at least one electrically conducting material, the layer based on the material of refractive index $n_1$ in step a) not being directly deposited on the substrate but on the lower layer.

The method may further include, after step c), a step for making a portion of electrically conducting material connecting the lower layer to the face including the plurality of recesses.

The method may further include, after step c) a step for depositing an upper layer based on an electrically conducting material over the layer of material of refractive index $n_1$.

Step c) may be a step for depositing at least one electroluminescent organic layer on the face of the layer of material of refractive index $n_1$ including the recesses, this electroluminescent organic layer being based on the material of refractive index $n_2$.

In an alternative, the method may include after step c), a step for depositing at least one electroluminescent organic layer on the layer of material of refractive index $n_1$.

The method may include, after the step for depositing the electroluminescent organic layer, a step for making a layer based on an electrically conducting and at least semi-transparent material on the electroluminescent organic layer.

SHORT DESCRIPTION OF THE DRAWINGS

The present invention will be better understood upon reading the description of exemplary embodiments given purely as an indication and by no means as a limitation with reference to the appended drawings wherein.

Identical, similar or equivalent portions of the figures described hereafter bear the same numerical references so as to facilitate passing from one figure to the other.

The different portions illustrated in the figures are not necessarily illustrated according to a uniform scale, in order to make the figures more legible.

The different possibilities (alternatives and embodiments) should be understood as not being exclusive of each other and they may be combined with each other.

DETAILED DISCUSSION OF PARTICULAR EMBODIMENTS

First of all reference will be made to FIG. 1A which illustrates a light-emitting device of the OLED type 100 according to a first embodiment.

The device 100 includes a stack of electroluminescent organic layers 102, positioned between a matrix of electrodes, here anodes, and an electrode 106, here a cathode, common to the entire device 100. In FIG. 1A, only two anodes 104a, 104b are illustrated. The device 100 also includes a substrate 108, for example based on silicon, comprising an addressing circuit formed in this first embodiment by an active matrix of transistors 107, or TFT matrix, in contact with the matrix of anodes 104a, 104b. In an alternative, this addressing circuit may also be achieved with integrated circuits. With each transistor 107, light emission from each pixel of the device 100 formed by one of the anodes 104a, 104b and a portion of the cathode 106 and of the stack of organic layers 102 located at the anode may be individually controlled by having a current flow between the anode and the cathode 106 through the organic layers 102. In this first embodiment, the light is emitted from the device 100, from the cathode 106.

This cathode 106 is partly reflective. For example, the cathode 106 may have reflectivity, or reflection ratio, comprised between about a few % and a few tens of %, for example equal to about 10%. The anodes 104a, 104b are reflective, for example with a reflection ratio above about 50%, advantageously above 80%, or even above 90%, and thus, each of the anodes 104a, 104b forms with a portion of the stack of electroluminescent organic layers 102 and of the cathode 106 located above the anodes 104a, 104b, an optical cavity corresponding to a pixel of the device 100. Two optical cavities 105a and 105b, formed by the stack of organic layers 102, the cathode 106 and the anodes 104a and 104b are illustrated in FIG. 1A. In this first embodiment, the anodes 104a, 104b and the cathode 106 are made on the basis of a metal material, for example based on aluminum and/or silver and/or gold and/or chromium and/or titanium and/or an alloy made from these metals.

Patterns forming recesses 110 are etched in the anodes 104a, 104b at one face of the anodes 104a, 104b located on the side of the optical cavities 105a, 105b. These recesses 110 are filled with a material 112 of refractive index $n_2$ different from the refractive index $n_1$ of the material forming the anodes 104a, 104b. This material 112 may be a dielectric or electrically conducting, transparent or semi-transparent material, such as for example based on photo-polymerizable resins, and/or on a polymer such as polyethylene dioxythiophene (PEDOT), and/or on ITO, and/or on silicon oxide, and/or on silicon nitride, and/or further on aluminum oxide.

In an alternative of this first embodiment, when the anodes 104a, 104b are made on the basis of a transparent or semi-transparent material, the recesses 110 may be etched through the face of the anodes 104a, 104b being in contact with the substrate 108. The recesses 110 are in this case also filled with the material 112 of refractive index $n_2$. The faces of the anodes 104a, 104b located on the side of the optical cavities 105a, 105b may then be planar. In another alternative, the recesses 110 may be made so as to be penetrating, i.e. forming holes which pass through the anodes 104a, 104b throughout their thickness.

Figure 2A:
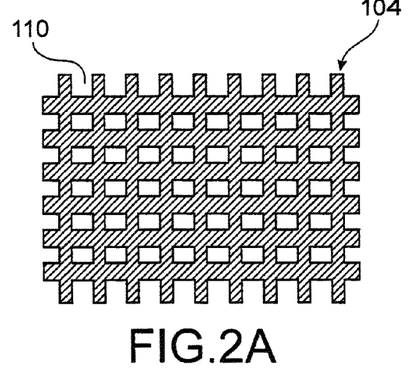
FIGS. 2A and 2B illustrate exemplary embodiments of an electrode of a light-emitting device of the OLED type, also object of the present invention.
Figure 2B:
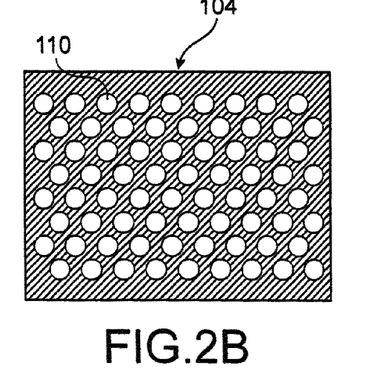

FIGS. 2A and 2B illustrate two exemplary recesses 110 made in an electrode 104. In FIG. 2A, the recesses 110 made have a rectangular section while the recesses 110 illustrated in FIG. 2B have a circular section. The recesses 110 may also be made according to a pattern different from those illustrated in FIGS. 2A and 2B.

The dimensions of the recesses 110 are here smaller than the emission wavelength of the organic layers 102 so as to form a homogeneous layer with respect to the light emitted by the organic layers 102. For example, the dimensions of the section of the recesses 110 (the diameter in the example of FIG. 2B and the sides in the example of FIG. 2A) may be comprised between about 10 nm and 400 nm. The depth of the recesses made is related to the difference between the refractive indexes $n_1$ and $n_2$. This depth is for example comprised between about 10 nm and 100 nm. For example, this depth is close to about 10 nm if there is a large difference between the indexes $n_1$ and $n_2$. On the other hand, this depth is of one or several hundred nanometers if the difference between the refractive indexes $n_1$ and $n_2$ is small. On a same anode 104, the recesses 110 are for example regularly distributed according to a period smaller than the emission wavelength of the organic layers, i.e. comprised between about 30 nm and 400 nm. This period for example represents the distance between the centers of two recesses 110 located one beside the other.

Thus, depending on the characteristics of the produced patterns (dimensions, depths, shapes and spacings of the recesses 110), on the refractive indexes $n_1$ and $n_2$ of the materials forming the anodes 104 and filling the recesses 110 as well as on the reflection ratio of the cathode 106 and on the anodes 104, it is possible to specifically define the resonance frequency of each optical cavity 105 as well as the directivity of the produced light emission.

Figure 1A:
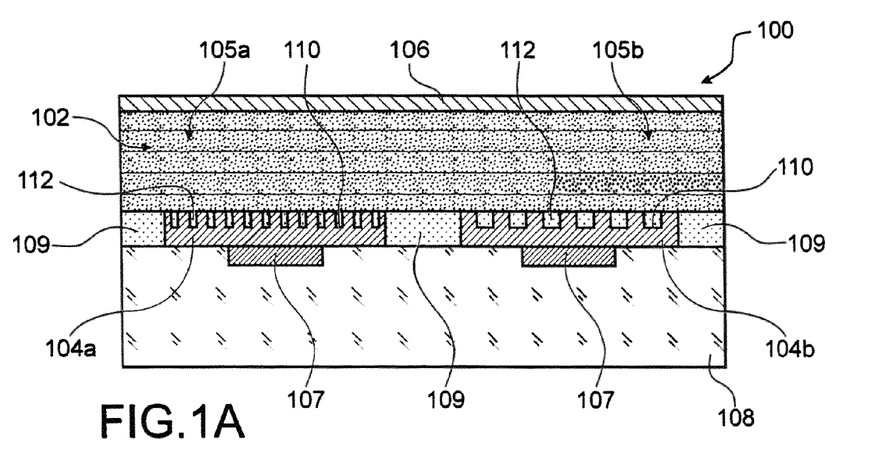
FIG. 1A illustrates a light-emitting device of the OLED type, object of the present invention, according to a first embodiment.

In the example of FIG. 1A, the recesses 110 made in the anode 104a do not have the same dimensions as the recesses 110 made in the anode 104b. Further, the repetition period of the pattern of the recesses 110 of the anode 104a is different from that of the anode 104b. It is also possible that the recesses 110 have different depths from pixel to the other. For this, it is not necessary to produce several etching levels because the etching rate may be different from one pixel to the other depending on the dimensions of the patterns, and therefore, it is possible to obtain recesses with different depths from one pixel to the other with a single etching level. Therefore, when the organic layers 102 emit light, the filtering achieved in the optical cavity 105a of the device 100 is different from the one achieved in the optical cavity 105b. Light emission is thereby obtained at the optical cavities 105a according to a wavelength different from that of the light emission produced at the optical cavity 105b, these two pixels of the device 100 therefore emit light of different color.

In an alternative of this first embodiment, it is possible not to fill the recesses 110 with the material 112, but to directly deposit the organic layers 102 on the anodes 104 so that the material of the organic layers 102 fills the recesses 110. The refractive index $n_2$ then designates the refractive index of the organic material of the layers 102.

In FIG. 1A, both anodes 104a, 104b are electrically insulated from each other by a portion of dielectric material 109, for example based on silica, positioned on the substrate 108.

Figure 3:
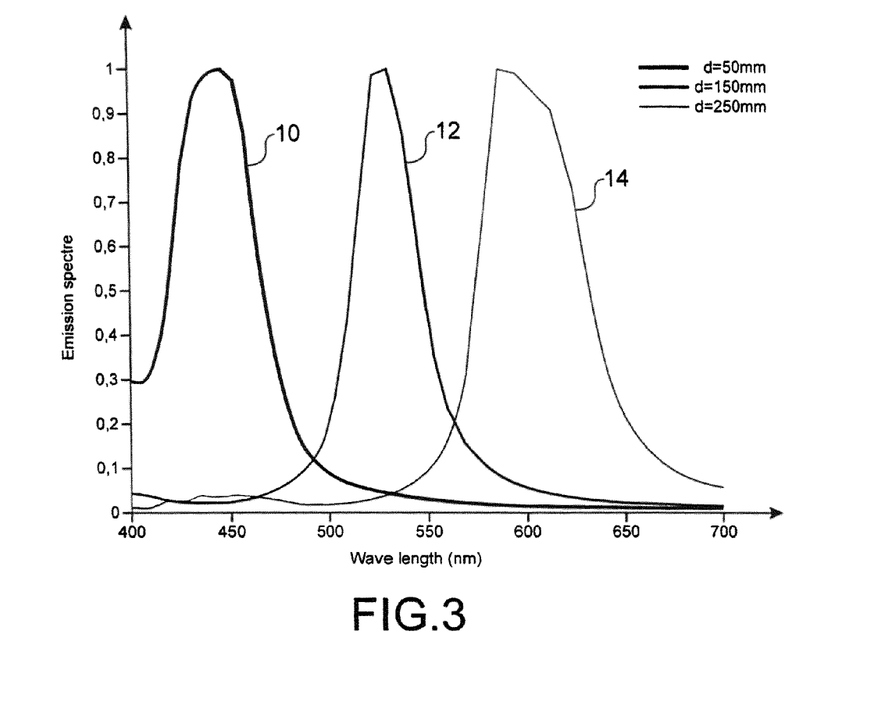
FIG. 3 illustrates results of simulation of light emission by a light-emitting device of the OLED type, object of the present invention.

FIG. 3 illustrates simulations of light emission of three pixels of the device 100. The anodes 104 of these pixels include recesses 110 positioned according to a grid of constant period and equal to about 300 nm and of a depth equal to about 80 nm, filled with a material 112 of refractive index $n_2$ substantially similar to the refractive index of the organic layers 102, 1.7 for example. The cathode 106 for example has a thickness equal for about 20 nm, the whole of the organic layers 102 has a thickness equal to about 100 nm, and the anodes 104 a thickness equal to about 300 nm. The electroluminescence obtained may be modeled by the oscillation of an electric dipole in the middle of each optical cavity. This dipole is oriented along the plane of the organic layers 102 and its emission spectrum, when it is not in an optical cavity, is very wide and quasi-homogeneous over the wavelength range from about 400 nm to 800 nm.

The curve 10 illustrates the emission spectrum obtained at the output of the device 100 through the cathode 106 for recesses 110 with a square section, for which the dimension d of the sides is equal to about 50 nm. It is seen that this emission spectrum is centered around a wavelength close to 450 nm, i.e. of blue color. The curve 12 illustrates the emission spectrum obtained for a dimension d of the sides of the square section of the recesses 110 equal to about 150 nm. This emission spectrum is centered around a wavelength close to about 525 nm, i.e. of green color. Finally, the curve 14 illustrates the emission spectrum obtained for a dimension d of the sides of the square section of recesses 110 equal to about 250 nm. This emission spectrum is centered around a wavelength close to about 600 nm, i.e. of red color. The CIE coordinates (1964 standard) of these curves 10, 12 and 14 are (0.16; 0.074), (0.27; 0.64) and (0.58; 0.39), respectively. It is therefore seen that by simply changing the dimensions of the recesses, light emission is obtained which may cover the range of the wavelengths of the visible spectrum.

The device 100 may be obtained by producing the matrix of anodes 104 by sputtering or evaporation on the substrate 108 including the active matrix of transistors 107. The recesses 110 are then produced for example by photolithography. In order to deposit the material 112 of refractive index $n_2$ in the recesses 110, deposition techniques by centrifugation (spin coating) may be applied if this material 112 is based on resin or PEDOT. If this material 112 is based on ITO, on silicon oxide or silicon nitride, CVD or sputtering techniques may be applied. After deposition of the material 112, a mechano-chemical planarization may then be achieved in order to obtain a layer of material 112, not protruding from the recesses 110.

Other techniques may be used for depositing material 112 in the recesses 110.

Electrical insulation may be achieved between the anodes 104 by etching trenches between the different pixels, and then by depositing silica, for example by CVD, followed by a mechano-chemical planarization step in order to form the portion of silica 109 so that the latter is approximately at the same height as the anodes 104.

The electroluminescent organic layers 102 may be deposited by vacuum evaporation or spin coating techniques.

The cathode 106 is finally deposited on the organic layers 102 by vacuum evaporation.

Figure 1B:
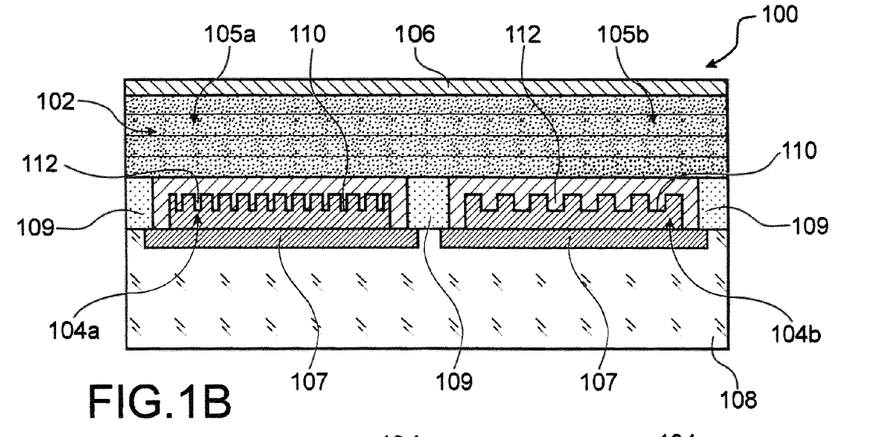
FIG. 1B illustrates a light-emitting device of the OLED type, object of the present invention, according to an alternative of the first embodiment.

Reference will now be made to FIG. 1B which illustrates the light-emitting device of the OLED type 100 according to an alternative of the first embodiment.

As compared with the device illustrated in FIG. 1A, the material 112 of refractive index $n_2$ here forms a layer deposited on the recesses 110, but also above the recesses 110 and beside the anodes 104a, 104b. In this alternative, the material 112 may be transparent or semi-transparent, and electrically conducting. Thus, when the anodes 104a, 104b are produced on the basis of a dielectric material, the material 112 provides the electric connection with the addressing circuit formed by the transistors 107.

Figure 4:
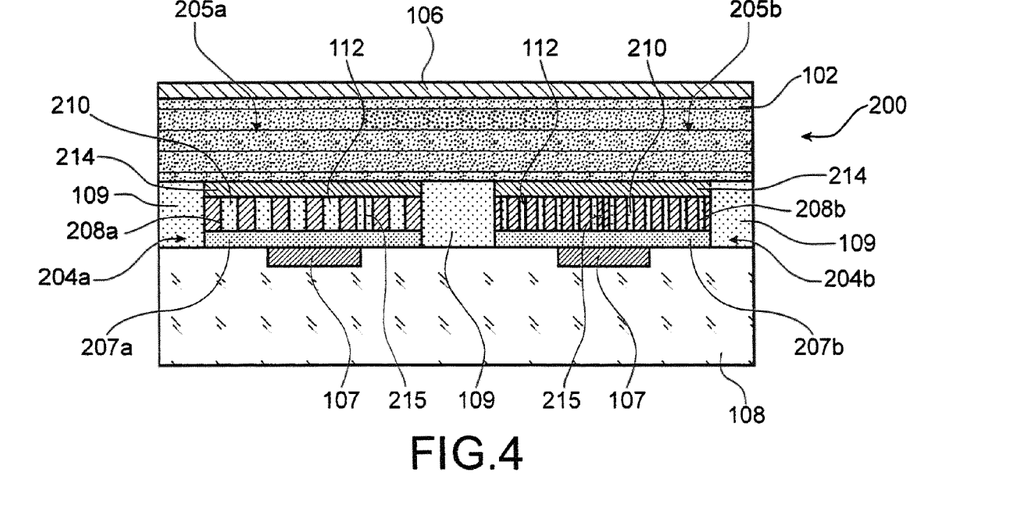
FIG. 4 illustrates a light-emitting device of the OLED type, object of the present invention, according to a second embodiment.

Reference will now be made to FIG. 4 which illustrates a light-emitting device of the OLED type 200 according to a second embodiment.

The device 200 includes the substrate 108 comprising the active matrix of transistors 107, the stack of electroluminescent organic layers 102, the filling material of refractive index $n_2$, the insulating portion 109 and the cathode 106 for example similar to the corresponding components of the device 100 of FIG. 1A. The device 200 also includes a matrix of anodes positioned on the substrate 108. Two anodes 204a and 204b are illustrated in FIG. 4. Unlike the anodes 104a, 104b of FIG. 1A, the anodes 204a, 204b each include a layer 207a and 207b, respectively, positioned on the substrate 108, based on an electrically conducting material, for example similar to the material of the anodes 104 of FIG. 1A.

Each anode 204 also includes a layer 208a, 208b based on a material of refractive index $n_1$ positioned on the conducting layer 207a, 207b. Patterns forming recesses 210 are etched in the layers 208a, 208b, at a face located on the side of optical cavities 205a, 205b formed by the anodes 204a, 204b, the organic layers 102 and the cathode 106. In this second embodiment, the recesses 210 are penetrating through, i.e. formed throughout the thickness of the layers 208a, 208b of refractive index $n_1$. These recesses 210 are filled with the material 112. The refractive index $n_1$ of the etched layers 208a, 208b is different from the refractive index $n_2$ of the material 112. As compared with the first embodiment, the dual layer structure of the anodes 204a, 204b allows the filling material 112 of refractive index $n_2$ to be combined with a vaster selection of materials, the material of refractive index $n_1$ either being conducting or not, as well as it is possible to benefit from selected etching, facilitating the control of etching. The layers 208a, 208b may be based on materials with a phase transition (having a metal behavior in the crystalline state and a dielectric behavior in the amorphous state), for example based on chalcogenide materials, such as indium antimonide. The layers 208a, 208b may also be based on an insulating material.

An electrically conducting and optically transparent or partly transparent layer 214, for example based on ITO, is positioned between the layers 208a, 208b and the stack of electroluminescent organic layers 102, on the anodes 204a, 204b, between the insulating portions 109, homogenizing the electric conduction at each pixel. It is seen in FIG. 4 that the portion of the layer 214 positioned on the anode 204a is not in contact with the portion of the layer 214 positioned on the anode 204b, in order to electrically insulate the pixels from each other. The layers 214 may also be based on TiN and have a thickness comprised between about 2 nm and 20 nm.

The material of the layers 208a, 208b and/or the filling material 112 may be electrically conducting, the anodes 204a, 204b then being electrically connected to the conducting layer 214 via these materials. However in the example illustrated in FIG. 4, these materials are dielectric materials. In this case, the device 200 includes portions of electrically conduction material 215 passing through the layers 208a, 208b of refractive index $n_1$ and/or the material of refractive index $n_2$ 112, and electrically connecting the lower connecting layers 207a, 207b to the upper conducting layers 214.

Further, when the device does not include conducting layers 207a, 207b, and the material of the layers 208a, 208b and possibly the filling material 112 are dielectrics, these portions of conducting material may electrically connect the conducting layers 214 to the addressing circuit formed here by the transistors 107.

In an alternative of the first and second embodiments, the structured electrode of an optical cavity may not be positioned against the substrate, but may be positioned above the electroluminescent organic layers, i.e. on the side of the electrode 106.

In another alternative of the first and second embodiments, both electrodes, anode and cathode, of an optical cavity may be structured. Parameterization of the resonance of the optical cavities is then accomplished at the recesses made in both electrodes.

In the embodiments described earlier, the electrodes 104a, 104b, 204a, 204b form anodes of the light-emitting device, and the electrode 106 forms the cathode of the device. However, it is possible that the electrodes 104a, 104b, 204a, 204b form cathodes, the electrode 106 then forms the anode of the light-emitting device.

The light emitting device is particularly suitable for producing a microdisplay of the OLED type. It may also be used for other applications, for example for producing a multicolor imaging device or a spectrophotometer.

The invention applies to all organic electroluminescence technologies, such as for example the light-emitting diodes of the PHOLED (Phosphorescent OLED) or PLED (Polymer Light Emitting Diode) type.

Finally, in the devices described earlier, the emission colors of the optical cavities are exclusively tuned by structuration of the electrode(s). Alternatively it is possible that the device includes colored filters with which the emission spectrum of the device may be refined, for example in order to improve the purity of the emitted color(s) and/or the peaks present in the emission spectrum may be suppressed. It is for example possible to use a full plate filter positioned on the device and common to the whole of the pixels of the device.

The invention claimed is:

1. A light-emitting device of the organic light emitting diode ("OLED") type including a plurality of optical cavities each forming a pixel of the light-emitting device and including at least one portion of at least one layer based on an electroluminescent organic material positioned between two electrodes, one of the electrodes is partly reflective and the other electrode is at least partly reflective, at least one of the two electrodes including at least one layer based on a material of refractive index $n_1$ including a structured face comprising a plurality of recesses filled with a material of refractive index $n_2$ different from $n_1$, the light being intended to be emitted from the device through one of the partly reflective electrodes, wherein at least a first optical cavity of the plurality of optical cavities includes the plurality of recesses regularly distributed according to a first recurrent pattern and filled with the material of refractive index $n_2$ different from $n_1$, wherein $n_1$, $n_2$, and a shape, dimensions and a period of the recesses of the first optical cavity are chosen so that a resonance frequency of the first optical cavity corresponds to a first given emission wavelength so as to obtain a filtering of the emission at said first given emission wavelength in the first optical cavity, and at least a second optical cavity of the plurality of optical cavities includes the plurality of recesses regularly distributed according to a second recurrent pattern and filled with the material of refractive index $n_2$ different from $n_1$, wherein $n_1$, $n_2$ and a shape, dimensions and a period of the recesses of the second optical cavity are chosen so that a resonance frequency of the second optical cavity corresponds to a second given emission wavelength so as to obtain a filtering of the emission at said second given emission wavelength in the second optical cavity, wherein the first given emission wavelength is different from the second given emission wavelength, and wherein, for each optical cavity, the dimensions and period of the recesses of said each optical cavity are smaller than the given emission wavelength associated to said each optical cavity in order to obtain said filtering.

2. The device according to claim 1, the recesses of a same optical cavity being of dimensions substantially similar to each other.

3. The device according to claim 1, the recesses having a depth in the layer of refractive index $n_1$ comprised between about 10 nm and a few hundred nm.

4. The device according to claim 1, the material of refractive index $n_1$ and/or the material of refractive index $n_2$ being electrically conducting.

5. The device according to claim 1, further including at least one lower layer, based on at least one electrically conducting material, or a metal material, on which the layer of refractive index $n_1$ is positioned.

6. The device according to claim 5, further including at least one portion of an electrically conducting material connecting the lower layer to the structured face.

7. The device according to claim 1, further including an upper layer based on at least one electrically conducting and optically transparent or partly transparent material, or indium-Tin Oxide ("ITO"), positioned on the layer of refractive index $n_1$.

8. The device according to claim 1, the material of refractive index $n_1$ and the material of refractive index $n_2$ being dielectrics.

9. The device according to claim 8, further including at least one lower layer, based on at least one electrically conducting material, or a metal material, on which the layer of refractive index $n_1$ is positioned, an upper layer based on at least one electrically conducting and optically transparent or partly transparent material, or Indium-Tin Oxide ("ITO"), positioned on the layer of refractive index $n_1$, and at least one portion of electrically conducting material electrically connecting the lower layer to the upper layer.

10. The device according to claim 1, the material of refractive index $n_2$ and/or the material of refractive index $n_1$ being transparent or partly transparent.

11. The device according to claim 1, the recesses passing through the layer of refractive index $n_1$.

12. The device according to claim 1, the recesses of the structured face of the electrode being positioned on the side of the optical cavity.

13. The device according to claim 1, the material of refractive index $n_2$ filling the recesses of the structured face of the electrode being the electroluminescent organic material forming the layer positioned between both electrodes.

14. The device according to claim 1, the material of refractive index $n_2$ filling the recesses of the structured face of the electrode being a material distinct from the electroluminescent organic material forming the layer positioned between both electrodes.

15. The device according to claim 1, further including a substrate against which is positioned one of the electrodes of the optical cavity.

16. The device according to claim 15, said electrode positioned against the substrate being the electrode including the layer with a structured face.

17. The device according to claim 15, the substrate including at least one addressing circuit electrically connected to the electrodes positioned against the substrate and driving the pixels of the device.

18. The device according to claim 17, the addressing circuit including a matrix of transistors, each of the pixels being driven by a transistor of this matrix via electrodes positioned against the substrate.

19. The device according to claim 17, further including, when the material of refractive index $n_1$ and the material of refractive index $n_2$ are dielectrics, a portion of conducting material electrically connecting the addressing circuit to the electrodes.

20. The device according to claim 1, the recesses of each electrode having different dimensions and/or period from one pixel to the other.

21. The device according to claim 1, the electrodes, including a layer with a structured face, of different pixels being electrically insulated from each other.

22. The device according to claim 1, the electrodes of each optical cavity which are not positioned against the substrate being formed by a single electrode common to all the optical cavities.

23. A method for making a light-emitting device of the organic light emitting diode ("OLED") type, including at least the steps of:
   a) depositing a layer based on a material of refractive index $n_1$ on a substrate,
   b) etching a plurality of recesses through at least one face of the layer,
   c) depositing a material of refractive index $n_2$, different from $n_1$, in the recesses, the device including a plurality of optical cavities each forming a pixel of the light-emitting device and including at least one portion of at least one layer based on an electroluminescent organic material positioned between both electrodes, one of the electrodes is partly reflective and the other electrode is at least partly reflective, at least one of the two electrodes including the layer based on the material of refractive index $n_1$, the light being intended to be emitted from the device through one of the partly reflective electrodes, wherein at least a first optical cavity of the plurality of optical cavities includes the plurality of recesses regularly distributed according to a first recurrent pattern and filled with the material of refractive index $n_2$ different from $n_1$, wherein $n_1$, $n_2$, and a shape, dimensions and a period of the recesses of the first optical cavity are chosen so that a resonance frequency of the first optical cavity corresponds to a first given emission wavelength so as to obtain a filtering of the emission at said first given emission wavelength in the first optical cavity, and at least a second optical cavity of the plurality of optical cavities includes the plurality of recesses regularly distributed according to a second recurrent pattern and filled with the material of refractive index $n_2$ different from $n_1$, wherein $n_1$, $n_2$ and a shape, dimensions and a period of the recesses of the second optical cavity are chosen so that a resonance frequency of the second optical cavity corresponds to a second given emission wavelength so as to obtain a filtering of the emission at said second given emission wavelength in the second optical cavity, wherein the first given emission wavelength is different from the second given emission wavelength, and wherein, for each optical cavity, the dimensions and period of the recesses of said each optical cavity are smaller than the given emission wavelength associated to said each optical cavity in order to obtain said filtering.

24. The method according to claim 23, further including before step a), a step for depositing a lower layer based on at least one electrically conducting material, the layer based on the material of refractive index $n_1$ in step a) not being directly deposited on the substrate but on the lower layer.

25. The method according to claim 24, further including after step c), a step for producing a portion of electrically conducting material, connecting the lower layer to the face including the plurality of recesses.

26. The method according to claim 23, further including after step c), a step for depositing an upper layer based on an electrically conducting material on the layer of material of refractive index $n_1$.

27. The method according to claim 23, step c) being a step for depositing at least one electroluminescent organic layer on the face of the layer of material of refractive index $n_1$ including the recesses, this electroluminescent organic layer being based on the material of refractive index $n_2$.

28. The method according to claim 23, including after step c), a step for depositing at least one electroluminescent organic layer on the layer of material of refractive index $n_1$.

29. The method according to claim 28, including after the step for depositing the electroluminescent organic layer, a step for producing a layer based on an electrically conducting and at least semi-transparent material on the electroluminescent organic layer.

* * * * *

UNITED STATES PATENT AND TRADEMARK OFFICE
CERTIFICATE OF CORRECTION

PATENT NO. : 8,614,698 B2  Page 1 of 1
APPLICATION NO. : 12/515247
DATED : December 24, 2013
INVENTOR(S) : Desieres et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 840 days.

Signed and Sealed this
Twenty-second Day of September, 2015

Michelle K. Lee
*Director of the United States Patent and Trademark Office*